US008875813B2

(12) United States Patent
Zhan et al.

(10) Patent No.: US 8,875,813 B2
(45) Date of Patent: Nov. 4, 2014

(54) ATOMIC LAYER DEPOSITION NANOCOATINGS ON CUTTING TOOL POWDER MATERIALS

(75) Inventors: Guodong Zhan, Spring, TX (US); Youhe Zhang, Tomball, TX (US); Feng Yu, Pleasant Grove, UT (US); Xian Yao, Sandy, UT (US); J. Daniel Belnap, Pleasant Grove, UT (US); Yuelin Shen, Houston, TX (US); Madapusi K. Keshavan, The Woodlands, TX (US)

(73) Assignee: Smith International, Inc., Houston, TX (US)

( * ) Notice: Subject to any disclaimer, the term of this patent is extended or adjusted under 35 U.S.C. 154(b) by 696 days.

(21) Appl. No.: 11/859,562

(22) Filed: Sep. 21, 2007

(65) Prior Publication Data

US 2008/0073127 A1  Mar. 27, 2008

Related U.S. Application Data

(60) Provisional application No. 60/846,218, filed on Sep. 21, 2006.

(51) Int. Cl.
*E21B 10/46* (2006.01)
*B24D 3/04* (2006.01)
*C22C 26/00* (2006.01)
*C22C 29/06* (2006.01)
*B24D 3/02* (2006.01)
*B22F 5/00* (2006.01)

(52) U.S. Cl.
CPC ............... *E21B 10/46* (2013.01); *C22C 26/00* (2013.01); *B22F 2005/001* (2013.01); *C22C 29/06* (2013.01); *B24D 3/02* (2013.01)
USPC .................. 175/434; 419/11; 51/295; 51/309

(58) Field of Classification Search
CPC .................................................. E21B 10/46
USPC .................... 75/242, 243; 419/11, 48, 49, 35; 427/212, 217, 215; 428/545; 51/307
See application file for complete search history.

(56) References Cited

U.S. PATENT DOCUMENTS

| | | |
|---|---|---|
| 2,941,241 A | 6/1960 | Strong |
| 2,941,248 A | 6/1960 | Hall |
| 2,947,611 A | 8/1960 | Bundy |
| 3,080,009 A | 3/1963 | Baker |
| 3,379,503 A | 4/1968 | McKenna |
| 3,609,818 A | 10/1971 | Wentorf, Jr. |
| 3,767,371 A | 10/1973 | Wentorf, Jr. et al. |
| 4,104,344 A | 8/1978 | Pope et al. |
| 4,124,888 A | 11/1978 | Washburn |
| 4,288,248 A | 9/1981 | Bovenkerk et al. |
| 4,289,503 A | 9/1981 | Corrigan |
| 4,341,577 A | 7/1982 | Vandenburgh |
| 4,372,404 A | 2/1983 | Drake |
| 4,428,906 A | 1/1984 | Rozmus |
| 4,525,178 A | 6/1985 | Hall |
| 4,643,741 A * | 2/1987 | Yu et al. ............ 51/295 |
| 4,656,002 A | 4/1987 | Lizenby et al. |
| 4,673,414 A | 6/1987 | Lavens et al. |
| 4,694,918 A | 9/1987 | Hall |
| 4,723,996 A | 2/1988 | Brunet et al. |
| 4,744,943 A | 5/1988 | Timm |
| 4,834,963 A | 5/1989 | Terry et al. |
| 4,945,073 A | 7/1990 | Dubensky et al. |
| 4,954,139 A | 9/1990 | Cerutti |
| 5,089,182 A | 2/1992 | Findeisen et al. |
| 5,106,392 A * | 4/1992 | Slutz et al. ............ 51/295 |
| 5,110,565 A | 5/1992 | Weimer et al. |
| 5,126,121 A | 6/1992 | Weimer et al. |
| 5,127,923 A | 7/1992 | Bunting et al. |
| 5,190,737 A | 3/1993 | Weimer et al. |
| 5,194,234 A | 3/1993 | Weimer et al. |
| 5,219,804 A | 6/1993 | Weimer et al. |
| 5,290,507 A | 3/1994 | Runkle |
| 5,340,417 A | 8/1994 | Weimer et al. |
| 5,370,195 A | 12/1994 | Keshavan et al. |
| 5,370,854 A | 12/1994 | Henley et al. |
| 5,380,688 A | 1/1995 | Dunmead et al. |
| 5,384,291 A | 1/1995 | Weimer et al. |
| 5,525,556 A | 6/1996 | Dunmead et al. |

(Continued)

FOREIGN PATENT DOCUMENTS

| | | |
|---|---|---|
| GB | 151532 A | 6/1978 |
| JP | 63223104 | 9/1988 |

(Continued)

OTHER PUBLICATIONS

Zang, J.B. et al., Characterization of silicon films grown by atomic layer deposition on nanocrystalline diamond, (2006), Diamond and Related Materials; pp. 1434-1437. Available online Dec. 13, 2005.*
Zang, J.B. et al., Ti Coating of Nanocrystalline Diamond by Atomic Layer Deposition, (Feb. 2006), Key Engineering Materials, vols. 304-305, pp. 48-51.*
Kawakami et al., Atomic layer deposition of Al2O3 thin film on diamond, (2005), Diamond & Related Material 14, 2015-2018.*
Jeffrey R. Wank et al., Nanocoating individual cohesive boron nitride particles in a fluidized bed by ALD; Powder Technology 142 (2004) 59-69.
Combined Search and Examination Report issued in GB Application No. 0718411.2 dated Apr. 24, 2008 (6 pages).
Examination Report issued in GB Application No. 0718411.2 dated Aug. 13, 2009 (2 pages).
Office Action issued Oct. 30, 2009 in corresponding Canadian patent application 2,603,458 (3 pages).

(Continued)

*Primary Examiner* — George Wyszomierski
*Assistant Examiner* — Ngoclan T Mai
(74) *Attorney, Agent, or Firm* — Osha Liang LLP

(57) ABSTRACT

A sintered body for cutting tools that includes hard particle phase comprising a plurality of hard particles, wherein at least a portion of the hard phase particles comprise a coating deposited by atomic layer deposition disposed thereon; and a binder phase is disclosed. The hard particles that may be included in the sintered bodies may include tungsten carbide, diamond, and boron nitride particles.

12 Claims, 4 Drawing Sheets

(56) References Cited

U.S. PATENT DOCUMENTS

| | | | |
|---|---|---|---|
| 5,536,485 A * | 7/1996 | Kume et al. ................ | 423/446 |
| 5,538,675 A | 7/1996 | Dunmead et al. | |
| 5,541,006 A | 7/1996 | Conley | |
| 5,607,297 A | 3/1997 | Henley et al. | |
| 5,643,843 A | 7/1997 | Dunmead et al. | |
| 5,755,299 A | 5/1998 | Langford, Jr. et al. | |
| 5,756,410 A | 5/1998 | Dunmead et al. | |
| 5,769,176 A | 6/1998 | Sumiya et al. | |
| 6,102,140 A | 8/2000 | Boyce et al. | |
| 6,106,957 A | 8/2000 | Fang | |
| 6,138,779 A | 10/2000 | Boyce | |
| 6,287,360 B1 | 9/2001 | Kembaiyan et al. | |
| 6,495,115 B1 | 12/2002 | Dunmead et al. | |
| 6,565,820 B1 | 5/2003 | Weimer et al. | |
| 6,613,383 B1 | 9/2003 | George et al. | |
| 6,673,439 B1 * | 1/2004 | Miyamoto et al. ............ | 428/336 |
| 6,689,191 B2 | 2/2004 | Dunmead et al. | |
| 6,713,177 B2 | 3/2004 | George et al. | |
| 6,812,471 B2 | 11/2004 | Popiolkowski et al. | |
| 6,872,378 B2 | 3/2005 | Weimer et al. | |
| 6,904,935 B2 | 6/2005 | Welty et al. | |
| 6,908,688 B1 | 6/2005 | Majagi et al. | |
| 6,913,827 B2 | 7/2005 | George et al. | |
| 6,921,712 B2 | 7/2005 | Soininen et al. | |
| 6,935,618 B2 | 8/2005 | Welty et al. | |
| 7,033,570 B2 | 4/2006 | Weimer et al. | |
| 7,115,245 B2 | 10/2006 | Zhao et al. | |
| 7,132,697 B2 | 11/2006 | Weimer et al. | |
| 2003/0019328 A1 | 1/2003 | Dunmead et al. | |
| 2003/0026989 A1 | 2/2003 | George et al. | |
| 2003/0182861 A1 | 10/2003 | Weimer et al. | |
| 2003/0208959 A1 | 11/2003 | Weimer et al. | |
| 2003/0230169 A1 | 12/2003 | Dunmead et al. | |
| 2003/0232138 A1 | 12/2003 | Tuominen et al. | |
| 2004/0038529 A1 | 2/2004 | Soininen et al. | |
| 2004/0056211 A1 | 3/2004 | Popiolkowski et al. | |
| 2004/0118455 A1 | 6/2004 | Welty et al. | |
| 2004/0121073 A1 | 6/2004 | George et al. | |
| 2004/0129314 A1 | 7/2004 | Welty et al. | |
| 2004/0159830 A1 | 8/2004 | Weimer et al. | |
| 2004/0194691 A1 | 10/2004 | George et al. | |
| 2004/0224087 A1 | 11/2004 | Weimer et al. | |
| 2005/0069487 A1 | 3/2005 | Zhao et al. | |
| 2005/0145417 A1 | 7/2005 | Radford et al. | |
| 2005/0181209 A1 | 8/2005 | Karandikar | |
| 2005/0215053 A1 | 9/2005 | Soininen et al. | |
| 2006/0024439 A2 | 2/2006 | Tuominen et al. | |
| 2006/0038156 A1 | 2/2006 | Welty et al. | |
| 2006/0140848 A1 | 6/2006 | Weimer et al. | |
| 2006/0188433 A1 | 8/2006 | Weimer et al. | |

FOREIGN PATENT DOCUMENTS

| | | | |
|---|---|---|---|
| WO | 8810321 A1 | 12/1988 | |
| WO | 9714534 A1 | 4/1997 | |
| WO | 9912736 A1 | 3/1999 | |
| WO | 0188972 A1 | 11/2001 | |
| WO | 0228802 A2 | 4/2002 | |
| WO | 0228980 A2 | 4/2002 | |
| WO | 03008186 A1 | 1/2003 | |
| WO | 03106168 A1 | 12/2003 | |
| WO | 2004078137 A2 | 9/2004 | |
| WO | 2005015065 A2 | 2/2005 | |
| WO | 2006073427 A2 | 7/2006 | |
| WO | 2007144733 A2 | 12/2007 | |

OTHER PUBLICATIONS

Examination Report under Section 18(3) issued Apr. 14, 2010 by the UK Intellectual Property Office in corresponding application No. GB0718411.2 (3 pages).

Examination Report under Section 18(3) issued Sep. 13, 2010 by the UK Intellectual Property Office in corresponding application No. GB0718411.2 (1 page).

Office Action dated Jun. 11, 2010 issued by the Canadian Intellectual Property Office in corresponding Canadian application No. 2,603,458 (2 pages).

Examiner's Report issued in related Canadian Patent Application No. 2,603,458; Dated: Jul. 25, 2012 (3 pages).

Office Action issued in related Canadian Patent Application No. 2,603,458; Dated Mar. 3, 2011 (3 pages).

Examination Report issued in related British Patent Application No. GB0717411.2; Dated Mar. 2, 2011 (2 pages).

P. Schwarzkopf, Cemented Carbides, The Macmillan Company, 1960, pp. 248-269.

Office Action issued in related Canadian Patent Application No. 2,603,458; Dated: Nov. 25, 2011 (3 pages).

Zang et al., "Ti Coating of Nanocrystalline Diamond by Atomic layer Deposition", Key Engineering Materials, vol. 304-305, pp. 48-51, Feb. 2006.

Examination Report issued in corresponding Canadian Application No. 2,603,458; Dated Mar. 12, 2014 (4 pages).

"Characterization of Thermal Sprayed Nanostructured WC-Co Coatings Derived From Nanocrystalline WC-18wt.%Co Powders"; Ban, Z.-G. and Shaw, L.L., Journal of Thermal Spray Technology, vol. 12(1) Mar. 2003, pp. 112-119 (8 pages).

"Atomic layer deposition of Al2O3 thin films on diamond"; Kawakami, N., Yokota, Y., Tachibana, T., Hayashi, K., and Kobashi, K.; Diamond & Related Materials 14 (2005); Kobe Steel, Ltd., Electronics Research Laboratory; pp. 2015-2018 (4 pages).

"Silicon Atomic Layer Deposition on Nanocrystalline Diamond"; Wang, Y.H., Lu, J., Qi, X.H., and Zang, J.B.; Key Engineering Materials vols. 315-316 (2006); Key Laboratory of Metastable Materials Science & Technology, Hebei, Yanshan University; College of Materials Science & Engineering, Yanshan University; pp. 436-439 (5 pages).

* cited by examiner

ATOMIC LAYER DEPOSITION NANOCOATINGS ON CUTTING TOOL POWDER MATERIALS

CROSS-REFERENCE TO RELATED APPLICATIONS

This application, pursuant to 35 U.S.C. §119(e), claims priority to U.S. patent application Ser. No. 60/846,218, filed Sep. 21, 2006, which is herein incorporated by reference in its entirety.

BACKGROUND OF INVENTION

1. Field of the Invention

Embodiments disclosed herein relate generally to composite materials used in cutting tools.

2. Background Art

Historically, there have been two types of drill bits used drilling earth formations, drag bits and roller cone bits. Roller cone bits include one or more roller cones rotatably mounted to the bit body. These roller cones have a plurality of cutting elements attached thereto that crush, gouge, and scrape rock at the bottom of a hole being drilled. Several types of roller cone drill bits are available for drilling wellbores through earth formations, including insert bits (e.g. tungsten carbide insert bit, TCI) and "milled tooth" bits. The bit bodies and roller cones of roller cone bits are conventionally made of steel. In a milled tooth bit, the cutting elements or teeth are steel and conventionally integrally formed with the cone. In an insert or TCI bit, the cutting elements or inserts are conventionally formed from tungsten carbide, and may optionally include a diamond enhanced tip thereon.

The term "drag bits" refers to those rotary drill bits with no moving elements. Drag bits are often used to drill a variety of rock formations. Drag bits include those having cutting elements or cutters attached to the bit body, which may be a steel bit body or a matrix bit body formed from a matrix material such as tungsten carbide surrounded by an binder material. The cutters may be formed having a substrate or support stud made of carbide, for example tungsten carbide, and an ultra hard cutting surface layer or "table" made of a polycrystalline diamond material or a polycrystalline boron nitride material deposited onto or otherwise bonded to the substrate at an interface surface.

Thus, some of the primary materials used in the formation of various components in drill bits, as well as other cutting tools, include tungsten carbide and diamond particles. In composites formed with tungsten carbide and diamond particles, the resulting composite includes the hard particle surrounded by metal binder, typically cobalt, which acts as a matrix. The individual hard particles thus are embedded in a matrix of a relatively ductile metal such that the ductile metal matrix provides the necessary toughness, while the grains of hard material in the matrix furnish the necessary wear resistance. The ductile metal matrix also reduces crack formation and suppresses crack propagation through the composite material once a crack has been initiated.

Polycrystalline diamond (PCD), a composite material formed from diamond particles, comprises a polycrystalline mass of diamonds (typically synthetic) that are bonded together to form an integral, tough, high-strength mass or lattice. A metal catalyst, such as cobalt, may be used to promote recrystallization of the diamond particles and formation of the lattice structure. Thus, cobalt particles are typically found within the interstitial spaces in the diamond lattice structure. The resulting PCD structure produces enhanced properties of wear resistance and hardness, making PCD materials extremely useful in aggressive wear and cutting applications where high levels of wear resistance and hardness are desired. However, cobalt has a significantly different coefficient of thermal expansion as compared to diamond. Therefore, upon heating of a diamond table, the cobalt and the diamond lattice will expand at different rates, causing cracks to form in the lattice structure and resulting in deterioration of the diamond table.

In order to obviate this problem, strong acids may be used to "leach" the cobalt from the diamond lattice structure. Examples of "leaching" processes can be found, for example in U.S. Pat. Nos. 4,288,248 and 4,104,344. Briefly, a hot strong acid, e.g., nitric acid, hydrofluoric acid, hydrochloric acid, or perchloric acid, or combinations of several strong acids may be used to treat the diamond table, removing at least a portion of the catalyst from the PDC layer.

Cemented tungsten carbide composites, such as WC—Co, are well known for their mechanical properties of hardness, toughness and wear resistance, making the composites a popular material of choice for use in such industrial applications as mining and drilling where their mechanical properties are highly desired. Because of the desired properties, cemented tungsten carbide has been the dominant material used as cutting tools for machining, hard facing, wear inserts, and cutting inserts in rotary cone rock bits, and substrate bodies for drag bit shear cutters. The mechanical properties associated with cemented tungsten carbide and other cermets, especially the unique combination of hardness toughness and wear resistance, make these materials more desirable than either metals or ceramics alone.

Many factors affect the durability of a tungsten carbide composite in a particular application. These factors include the chemical composition and physical structure (size and shape) of the carbides, the chemical composition and microstructure of the matrix metal or alloy, and the relative proportions of the carbide materials to one another and to the matrix metal or alloy. Generally, as the tungsten carbide particle size and/or cobalt content decrease, higher hardness, compressive strength, and wear resistance, but lower toughness is achieved. Conversely, larger particle sizes and/or higher cobalt content yields high toughness and impact strength, but lower hardness.

Many different types of tungsten carbides are known based on their different chemical compositions and physical structure. Among the various types of tungsten carbide commonly used in drill bit components are cast tungsten carbide, macro-crystalline tungsten carbide, carburized tungsten carbide, and cemented tungsten carbide (also known as sintered tungsten carbide).

One type of tungsten carbide is macro-crystalline carbide. This material is essentially stoichiometric tungsten carbide created by a thermite process. Most of the macro-crystalline tungsten carbide is in the form of single crystals, but some bicrystals of tungsten carbide may also form in larger particles. Single crystal stoichiometric tungsten carbide is commercially available from Kennametal, Inc., Fallon, Nev.

Carburized carbide is yet another type of tungsten carbide. Carburized tungsten carbide is a product of the solid-state diffusion of carbon into tungsten metal at high temperatures in a protective atmosphere. Sometimes, it is referred to as fully carburized tungsten carbide. Such carburized tungsten carbide grains usually are multi-crystalline, i.e., they are composed of tungsten carbide agglomerates. The agglomerates form grains that are larger than the individual tungsten carbide crystals. These large grains make it possible for a metal infiltrant or an infiltration binder to infiltrate a powder of such large grains. On the other hand, fine grain powders, e.g., grains less than 5 μm, do not infiltrate satisfactorily. Typical carburized tungsten carbide contains a minimum of 99.8% by weight of tungsten carbide, with a total carbon content in the range of about 6.08% to about 6.18% by weight.

Cast tungsten carbide, on the other hand, is formed by melting tungsten metal (W) and tungsten monocarbide (WC) together such that a eutectic composition of WC and $W_2C$, or a continuous range of compositions therebetween, is formed. Cast tungsten carbide typically is frozen from the molten state and comminuted to a desired particle size.

A fourth type of tungsten carbide, which has been typically used in hardfacing, is cemented tungsten carbide, also known as sintered tungsten carbide. Sintered tungsten carbide comprises small particles of tungsten carbide (e.g., 1 to 15 microns) bonded together with cobalt. Sintered tungsten carbide is made by mixing organic wax, tungsten carbide and cobalt powders, pressing the mixed powders to form a green compact, and "sintering" the composite at temperatures near the melting point of cobalt. The resulting dense sintered carbide can then be crushed and comminuted to form particles of sintered tungsten carbide.

For conventional cemented tungsten carbide, the mechanical property of fracture toughness is inversely proportional to hardness, and wear resistance is proportional to hardness. Although the fracture toughness of cemented tungsten carbide has been somewhat improved over the years, it is still a limiting factor in demanding industrial applications such as high penetration drilling, where cemented tungsten carbide inserts often exhibit gross brittle fracture that can lead to catastrophic failure. Traditional metallurgical methods for enhancing fracture toughness, such as grain size refinement, cobalt content optimization, and strengthening agents, have been substantially exhausted with respect to conventional cemented tungsten carbide.

PCD, discussed above, is another type of material that is known to have desirable properties of hardness, and wear resistance, making it especially suitable for those demanding applications described above where high wear resistance is desired. However, this material also suffers from the same problem as cemented tungsten carbide, in that it also displays properties of low fracture toughness that can result in gross brittle failure during usage.

Regardless of the type of material used in a particular drilling application, designers continue to seek improved properties (such as improved wear resistance, thermal resistance, fracture toughness etc.) in the composite material. Unfortunately, further compounding the low fracture toughness is that, in the formation of the various types of composite materials, conventional powder mixing techniques and infiltration methods do not always uniformly distribute the diamond or tungsten carbide particles in the binder material. Thus, non-homogenous microstructures frequently result, where the hard material (i.e., diamond or tungsten carbide) agglomerates and the binder metal pools. Because the binder material, which provides ductility and thus the fracture toughness to a composite material, is not homogenously distributed through the composite material, the composite material possesses a lower fracture toughness and impact strength. Further, in the particular context of diamond composites, low thermal stability arises from the difference in thermal expansion coefficients.

One suggested technique, both in the context of hardfacing and inserts, has been to apply a "coating" layer around the hard particles, either diamond or tungsten carbide particles, to improve various mechanical properties, including thermal stability and toughness. Such disclosure of coating hard particles is described, for example, in U.S. Pat. Nos. 5,755,299, 6,102,140, 6,106,957, and 6,138,779.

In U.S. Pat. No. 6,106,957, it is disclosed that by coating the super-hard particles in the matrix material, the resulting microstructure may be obtained where the resulting composite material is generally substantially free of large clusters of grains of the super-hard material and the average size of the matrix metal pools in the composite is smaller than the average size of the grains of the super-hard material.

Currently practiced commercial methods of coating include wet chemistry, physical vapor deposition (PVD), chemical vapor deposition (CVD), and plasma-enhanced CVD (PE-CVD). While these methods offer outstanding coating processes for flat substrates and large particles where relatively thick and non-uniform coatings are acceptable, they do not allow for the controlled ultra-thin coating of individual ultra-fine particles such as those used in the formation of composite materials for cutting tools. Application of thick, non-uniform coatings may result in alteration of the bulk properties of the particulate material, and thus material properties of the resulting composite material.

Accordingly, there exists a continuing need for improvements in the material and/or thermal properties of composite materials used drilling applications.

SUMMARY OF INVENTION

In one aspect, embodiments disclosed herein relate to a sintered body for cutting tools that includes a plurality of hard phase particles, wherein at least a portion of the hard phase particles include a coating deposited by atomic layer deposition disposed thereon; and a ductile phase separating the plurality of hard phase particles from each other.

In another aspect, embodiments disclosed herein relate to a sintered body for cutting tools that includes a plurality of carbide particles, wherein at least a portion of the carbide particles comprises a coating deposited by atomic layer deposition disposed thereon; and a ductile phase separating the plurality of carbide particles from each other.

In yet another aspect, embodiments disclosed herein relate to a sintered body for cutting tools that includes a plurality of diamond particles, wherein at least a portion of the diamond particles comprises a coating deposited by atomic layer deposition disposed thereon; and a ductile phase separating the plurality of diamond particles from each other.

In yet another aspect, embodiments disclosed herein relate to a sintered body for cutting tools that includes a plurality of hard phase particles, wherein at least a portion of the hard phase particles comprises a substantially uniform coating disposed thereon; and a ductile phase separating the plurality of hard phase particles from each other, wherein the plurality of hard phase particles have an average particle size less than about 100 microns, and wherein the coating comprises from about 1 to 5 volume percent of the coated hard particle.

Other aspects and advantages of the invention will be apparent from the following description and the appended claims.

DETAILED DESCRIPTION

In one aspect, embodiments disclosed herein relate to composite materials used in components of downhole cutting tools, including drill bits. In particular, embodiments related to composite materials formed from coated hard particles surrounded by a matrix material.

Ceramic materials generally used in the cutting tool industry include metal carbides, borides, silicides, nitrides, and diamond. Cermet materials are materials that comprise both a ceramic material and a metal material. An example cermet material is cemented tungsten carbide (WC—Co) that is made from tungsten carbide (WC) grains and cobalt (Co). Another class of cermet materials is polycrystalline diamond (PCD) and polycrystalline cBN (PCBN) that have been synthesized by high temperature/high pressure processes, for example.

Figure 1:
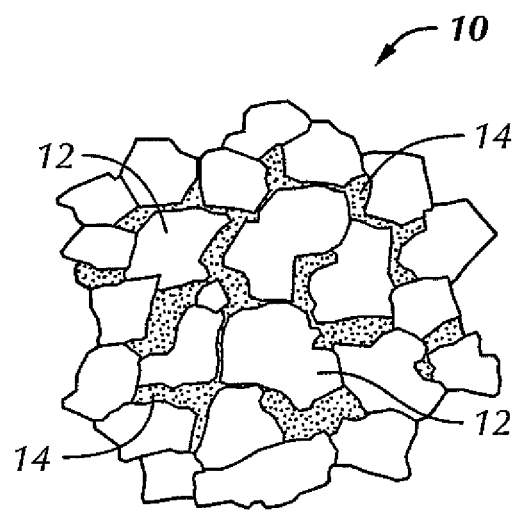
FIG. 1 shows a microstructure of a conventional tungsten carbide composite.

FIG. 1 illustrates the conventional microstructure of cemented tungsten carbide. As shown in FIG. 1, cemented tungsten carbide 10 includes tungsten carbide grains 12 that are bonded to one another by a cobalt phase 14. As illustrated, tungsten carbide grains may be bonded to other grains of tungsten carbide, thereby having a tungsten carbide/tungsten carbide interface, and/or may be bonded to the cobalt phase, thereby having a tungsten carbide/cobalt interface. The unique properties of cemented tungsten carbide result from this combination of a rigid carbide network with a tougher metal substructure. The generic microstructure of cemented tungsten carbide, a heterogenous composite of a ceramic phase in combination with a metal phase, is similar in all cermets, including polycrystalline diamond.

The relatively low fracture toughness of cemented tungsten carbide has proved to be a limiting factor in more demanding applications, such as inserts in roller cone rock bits, hammer bits and drag bits used for subterranean drilling and the like. It is possible to increase the toughness of the cemented tungsten carbide by increasing the amount of cobalt present in the composite. The toughness of the composite mainly comes from plastic deformation of the cobalt phase during the fracture process. Yet, the resulting hardness of the composite decreases as the amount of ductile cobalt increases. In most commonly used cemented tungsten carbide grades, cobalt is no more than about 20 percent by weight of the total composite.

As evident from FIG. 1, the cobalt phase is not necessarily continuous in the conventional cemented tungsten carbide microstructure, particularly in compositions having a low cobalt concentration. Further, while a relatively uniform distribution of tungsten carbide (or diamond) in a cobalt matrix is desired, typically inadequate mixing/infiltration results in agglomerates of tungsten carbide (or diamond) particles and pools of cobalt. Thus, a crack propagating through the composite will often travel through the less ductile tungsten carbide grains, either transgranularly through tungsten carbide/cobalt interfaces or intergranularly through tungsten carbide/tungsten carbide interfaces. As a result, cemented tungsten carbide often exhibits gross brittle fracture during more demanding applications, which may lead to catastrophic failure.

Generally, embodiments of the present disclosure may include composite constructions comprising a hard phase of hard particulate materials and a relatively softer binder phase. The hard phase particles may be provided with an ultra-thin conformal coating on the surface thereof prior to be transformation into a cermet or sintered composite material for use as a cutting tool component.

In a particular embodiment, the hard phase particulate material of the present disclosure may be provided with an ultra-thin, conformal coating thereon. As used herein, "ultra-thin" refers to a thickness of less than 100 nm. In a particular embodiment, the ultra-thin coating may have a thickness ranging from about 0.1 to about 50 nm, from about 0.5 to 35 nm in another embodiment, and from about 1 to 10 nm in yet another embodiment. "Conformal" refers to a relatively uniform thickness across the surface of the particle such that the surface shape of a coated particle closely resembles that of the uncoated particle.

In another embodiment, the hard phase particles of the present disclosure are provided with a conformal coating thereon, wherein the conformal coating comprises from about 1 to 5 volume percent of the coated hard particle. In a particular embodiment, the conformal coating comprises from about 1 to 3 volume percent of the volume of the coated hard particle.

Depending on the desired application of the particulate material and the type of hard phase particulate material to be coated, the composition of the coatings may vary. In a particle embodiment, the coating may include a sinterable material including, for example, metals, metal alloys, ceramic materials, and cermets. For example, coatings that may be suitable for use on the hard phase particulate materials of the present disclosure may include metals and binary materials, i.e., materials of the form $Q_xR_y$, where Q and R represent different atoms and x and y are numbers that reflect an electrostatically neutral material. Among the suitable binary materials are various inorganic ceramic materials including oxides, nitrides, carbides, sulfides, fluorides, and combinations thereof. Examples of oxides that may find used in the present disclosure include those such as CoO, $Al_2O_3$, $TiO_2$, $Ta_2O_5$, $Nb_2O_5$, $ZrO_2$, $HfO_2$, $SnO_2$, ZnO, $La_2O_3$, $Y_2O_3$, $CeO_2$, $Sc_2O_3$, $Er_2O_3$, $V_2O_5$, $SiO_2$, $In_2O_3$, and the like. Examples of nitrides that may find use in the present disclosure include those such as $Si_3N_4$, AlN, TaN, NbN, TiN, MoN, ZrN, HfN, GaN, and the like. Examples of carbides that may find use in the present disclosure include those such as SiC, WC, and the like. Examples of sulfides that may find use in the present disclosure include those such as ZnS, SrS, CaS, PbS, and the like. Examples of fluorides that may find use in the present disclosure include those such as $CaF_2$, $SrF_2$, $ZnF_2$, and the like. Among the suitable metal coatings include Pt, Ru, Ir, Pd, Cu, Fe, Co, Ni, W, and the like. Other types of materials that may be used to form an ultra-thin conformal coating include those described in U.S. Pat. No. 6,613,383, which is hereby incorporated by reference in its entirety. Coatings suitable for use in the present disclosure may also include mixed structures, such as TiAlN, $Ti_3AlN$, ATO (AlTiO), coatings included doped metals, such as ZnO:Al, ZnS:Mn, SrS:Ce, $Al_2O_3$:Er, $ZrO_2$:Y, which may also include other rare earth metals ($Ce^{3+}$, $Tb^{3+}$, etc.) for doping or co-doping, or nanolaminates, such as $HfO_2/Ta_2O_5$, $TiO_2/Ta_2O_5$, $TiO_2/Al_2O_3$, $ZnS/Al_2O_3$, and the like. Further, other inorganic species such as inorganic polymers may be suitable for coatings of the present disclosure, including inorganic polymers such as, for example, polysilanes, polysiloxanes, polystannanes, polyphosphazene, polysulfides, and hybrid polymers of a grafted inorganic and organic polymer.

In a particular embodiment, the coating itself may be a reagent or catalyst that functions as a sintering aid in the formation of a cermet composite. Thus, the ultra-thin coating may provide a high surface area of catalyst or reactive material and/or provide a means for finely dispersing the coating material. For example, the hard phase sinterable particulate materials of the present disclosure may be coated with a material such as aluminum oxide, which may function as a sintering aid. When the coating comprises such a sintering aid or catalyst compound, it may or may not be desirable to add additional binder powder to the hard particles for sintering. For example, in forming PCD or PCBN, it may be desirable to only include binder in the form of a conformal coating (such as Co, Ni, or Fe, and Al- or Ti-containing compounds, respectively), which may allow for decreased amounts of binder necessary to effect formation of the polycrystalline structure. This may also reduce the amount of binder pooling that may cause thermal instability in the structure. A porous microstructure may result when no additional binder material is added; however, such pores may be reduced by either furthering consolidation or by filling the volume with a secondary material, such by processes known in the art and described in U.S. Pat. No. 5,127,923, which is herein incorporated by reference in its entirety.

In a particular embodiment, the ultra-thin, conformal coating of the present disclosure may be applied on the particulate materials through atomic layer controlled growth techniques or atomic layer deposition (ALD). ALD methods use self-limiting surface chemistry to control deposition. Under the appropriate conditions, deposition may be limited to a small number of functional groups on the surface, i.e., approximately one monolayer or $\sim 1 \times 10^{15}$ species per $cm^2$. ALD permits the deposition of coatings of up to about 0.3 nm in thickness per reaction cycle, and thus provide a means for controlling thickness to extremely fine thicknesses. In these techniques, the coating may be formed in a series of two or more self-limited reactions, which in most instances can be repeated to subsequently deposit additional layers of the coating material until a desired coating thickness is achieved. In most instances, the first of these reactions may involve some functional group on the surface of the particle, such as an M—H, M—O—H, or M—N—H group, where M represents an atom of a metal or semi-metal. The individual reactions may be carried out separately and under conditions such that all excess reagents and reaction products are removed before concluding the succeeding reaction. The particles may optionally be treated prior to initiating the reaction sequence to remove volatile materials that may have absorbed onto the surface of the particulate materials. This may be readily done by exposing the particles to elevated temperatures and/or vacuum.

Additionally, in some instances a precursor reaction may be performed to introduce desirable functional groups onto the surface of the particle to facilitate a reaction sequence in creating an ultra-thin coating. Examples of such functional groups include hydroxyl groups, amino groups, and metal-hydrogen bonds, which may serve as a site of further reaction to allow formation of an ultra-thin coating. Functionalities may be achieved through surface treatments including, for example, water plasma treatment, ozone treatment, ammonia treatment, and hydrogen treatment.

Oxide coatings can be prepared on particles having surface hydroxyl or amine (M—N—H) groups using a binary (AB) reaction sequence as follows. The asterisk (*) indicates the atom that resides at the surface of the particle or coating, and Z represents oxygen or nitrogen. $M^1$ is an atom of a metal (or semimetal such as silicon), particularly one having a valence of 3 or 4, and X is a displaceable nucleophilic group. The reactions shown below are not balanced, and are only intended to show the reactions at the surface of the particles (i.e., not inter- or intralayer reactions).

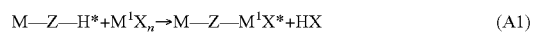

$$M—Z—H^* + M^1X_n \rightarrow M—Z—M^1X^* + HX \quad (A1)$$

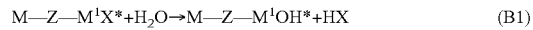

$$M—Z—M^1X^* + H_2O \rightarrow M—Z—M^1OH^* + HX \quad (B1)$$

In reaction A1, reagent $M^1X_n$ reacts with one or more M—Z—H groups on the surface of the particle to create a "new" surface group having the form —$M^1X$. $M^1$ is bonded to the particle through one or more Z atoms. The —$M^1X$ group represents a site that can react with water in reaction B1 to regenerate one or more hydroxyl groups. The groups formed in reaction B1 can serve as functional groups through which reactions A1 and B1 can be repeated, each time adding a new layer of $M^1$ atoms. Atomic layer controlled growth and additional binary reactions are described in more detail in U.S. Pat. No. 6,613,383, which is herein incorporated by reference in its entirety.

Figure 2:
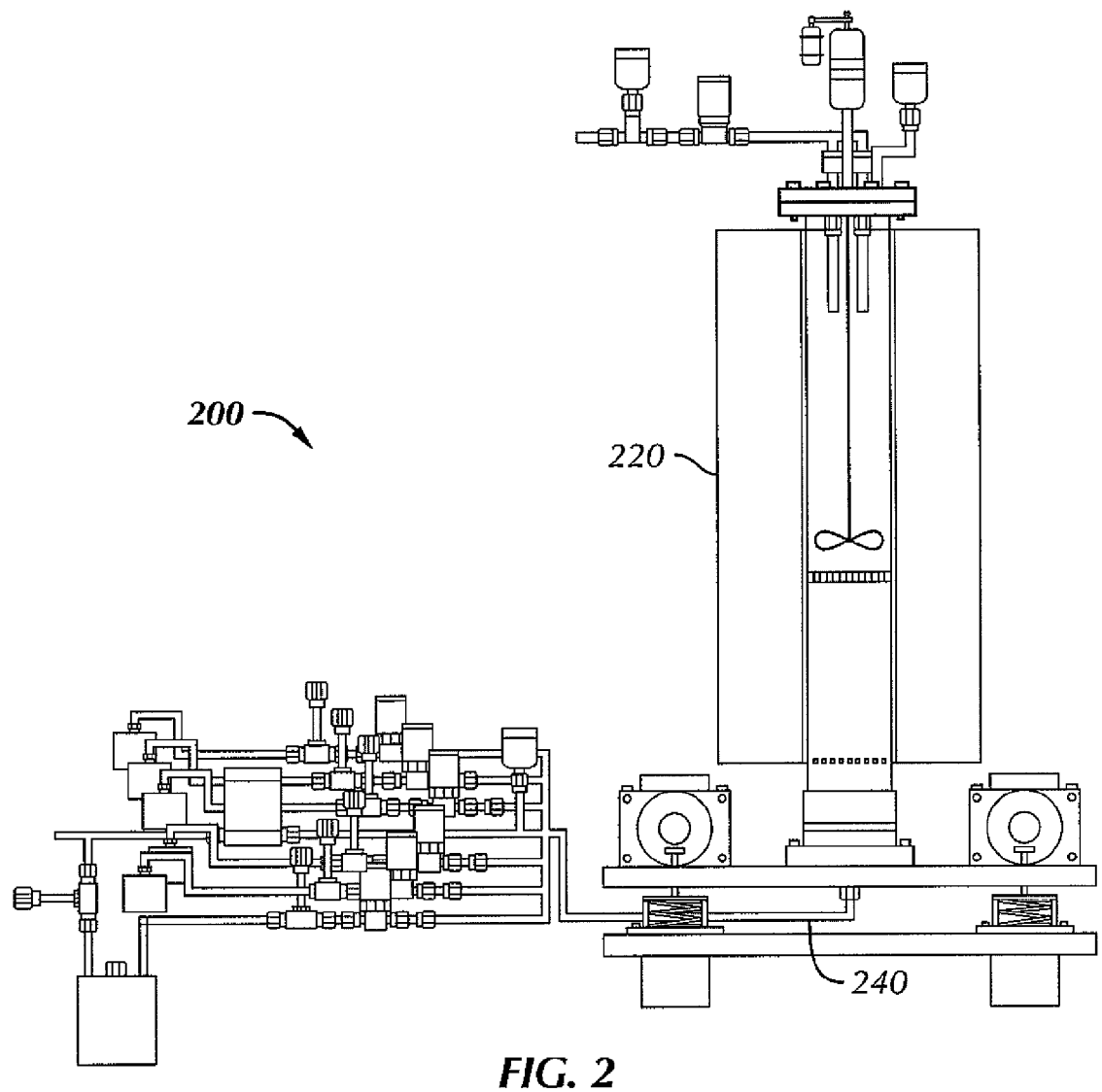
FIG. 2 shows a fluidized bed reactor that may be used in accordance with one embodiment of the present disclosure.

A convenient method for applying the ultra-thin, conformal coating to particulate material is to form a fluidized bed of the particles, and then pass the various reagents in turn through the fluidized bed under reaction conditions. Methods of fluidizing particulate material are well known and are described, for example, "Nanocoating Individual Cohesitve Boron Nitride Particles in a Fluidized Bed Reactor," Jeffrey R. Wank, et al., Powder Technology 142 (2004) 59-69. Briefly, the ALD process using a fluidized bed reactor, illustrated in FIG. 2, is described. Uncoated particles may be supported on a porous plate or screen 220 within a fluidized bed reactor 200. A fluidizing gas (such as $N_2$) may be passed into the reactor 200 through line 240 and upwardly through the plate or screen 220, lifting the particles and creating a fluidized bed. Fluid (gaseous or liquid) reagents may be introduced into the bed 200 also through line 240 for reaction with the surface of the particles. The fluidizing gas may also act as an inert purge gas following each dosing of the particles with reagent for removing unreacted reagents and volatile or gaseous reaction products.

If desired, multiple layers of ultra-thin coatings may be deposited on the particulate material. For example, an intermediate ultra-thin layer may be applied to provide a surface to which a desired outer layer can be applied more easily. Where multiple layers of coating are desired, the multiple layers may possess an identity of composition, or the multiple layers may vary in composition. It is specifically within the scope of the present disclosure that the multiple layers may include combinations of any of the above described coating compositions such, for example, metal-on-metal, metal-on-oxide, and oxide-on-oxide. One of ordinary skill in the art would recognize that depending on the compositions of the applied coating, during any subsequent sintering conditions, the coating may undergo a number of transitions. For example, an ALD bi-layer of $Al_2O_3/TiO_2$, after sintering, may react and form an aluminum titanate coating. Further one of ordinary skill in the art would recognize that there is no limitation on the combination or number of layers which may be provided on the particulate material of the present disclosure. It is also specifically within the scope of the present disclosure that a subsequent coating layer may be deposited by a method other than ALD, such as CVD or PVD, for example, on an ALD-deposited coating.

Alternatively, a coating may be applied using atomic layer deposition methods as described above, and the coating may subjected to one or more reactions to form a modified coating. This technique may be used, for example, for creating ultra-thin coatings of various types that are not amenable to deposition using atomic layer deposition techniques. For example, various types of ultra-thin oxide coatings can be formed using the atomic layer deposition techniques described above, and then can be carburized to convert the oxide to the corresponding carbide.

The coatings disclosed herein may, in various embodiments, be either amorphous or crystalline in nature. Further, if a coating is amorphous in nature and is desirably crystalline, the particle having the coating thereon may be placed in a furnace at the appropriate environment for crystallization of the coating. In a particular embodiment, crystallization may occur in air at temperature of at least 600° C.

Once the hard particulate material is coated with an ultra-thin coating as described above, it may be used to form a component of a cutting tool. Hard phase particulate materials that may be provided with an ultra-thin, conformal coating thereon include various materials used to form cermet materials having application in the cutting tool industry. In one embodiment, the hard particles may include tungsten carbide particles and diamond particles. In other various embodiments, the hard particles may include metal carbides, such as tungsten, titanium, and tantalum carbides, natural diamond, synthetic diamond, cubic boron nitride (or wurtzite boron nitride), and the like. One of ordinary skill in the art would appreciate that the selection of a conformal coating may vary depending on the type of hard particles being coated and/or desired resulting properties for the composite. For example, in some embodiments, particles may be coated with a binder material (e.g., tungsten carbide with cobalt or nickel, diamond with cobalt or nickel, cubic boron nitride with aluminum or titanium-containing compounds), or with a material that may provide a protective or insulating layer including $Al_2O_3$, WC, $TiO_2$ (on any of the hard particles) such as to prevent surface chemical reactions and/or to physically expel thermally detrimental binder out from the grain junctions/boundaries.

Suitable particle sizes for the hard phase particulate material of the present disclosure may range up to 500 microns in one embodiment, and from the nanometer range (e.g., about 0.001 microns) to about 100 microns in another embodiment, and from about 0.005 to 50 microns in yet another embodiment. However, one of ordinary skill in the art would recognize that the ultra-thin, conformal coatings disclosed herein may also be provided on particles having a larger particle size, such as, for example, diamond grit. Particle size can also be expressed in terms of the surface area of the particles. In a particular embodiment, the hard particles may have a particle size ranging from 10 to $10^6$ times the thickness of the coating deposited thereon, In one embodiment, the particulate materials of the present disclosure have surface areas ranging from about 0.1 to 200 $m^2/g$ or more.

Coated carbide particles may be used to form a carbide composite by mixing carbide particles with a metal catalyst. Among the types of tungsten carbide particles that may be used to form sintered bodies of the present disclosure include cast tungsten carbide, macro-crystalline tungsten carbide, carburized tungsten carbide, and cemented tungsten carbide.

As discussed above, one type of tungsten carbide is macrocrystalline carbide. This material is essentially stoichiometric WC in the form of single crystals. Most of the macrocrystalline tungsten carbide is in the form of single crystals, but some bicrystals of WC may form in larger particles. The manufacture of macrocrystalline tungsten carbide is disclosed, for example, in U.S. Pat. Nos. 3,379,503 and 4,834,963, which are herein incorporated by reference.

U.S. Pat. No. 6,287,360, which is assigned to the assignee of the present invention and is herein incorporated by reference, discusses the manufacture of carburized tungsten carbide. Carburized tungsten carbide, as known in the art, is a product of the solid-state diffusion of carbon into tungsten metal at high temperatures in a protective atmosphere. Carburized tungsten carbide grains are typically multi-crystalline, i.e., they are composed of WC agglomerates. The agglomerates form grains that are larger than individual WC crystals. These larger grains make it possible for a metal infiltrant or an infiltration binder to infiltrate a powder of such large grains. On the other hand, fine grain powders, e.g., grains less than 5 microns, do not infiltrate satisfactorily. Typical carburized tungsten carbide contains a minimum of 99.8% by weight of carbon infiltrated WC, with a total carbon content in the range of about 6.08% to about 6.18% by weight. Tungsten carbide grains designated as WC MAS 2000 and 3000-5000, commercially available from H.C. Stark, are carburized tungsten carbides suitable for use in the formation of the matrix bit body disclosed herein. The MAS 2000 and 3000-5000 carbides have an average size of 20 and 30-50 micrometers, respectively, and are coarse grain conglomerates formed as a result of the extreme high temperatures used during the carburization process.

Another form of tungsten carbide is cemented tungsten carbide (also known as sintered tungsten carbide), which is a material formed by mixing particles of tungsten carbide, typically monotungsten carbide, and cobalt particles, and sintering the mixture. Methods of manufacturing cemented tungsten carbide are disclosed, for example, in U.S. Pat. Nos. 5,541,006 and 6,908,688, which are herein incorporated by reference. Sintered tungsten carbide is commercially available in two basic forms: crushed and spherical (or pelletized). Crushed sintered tungsten carbide is produced by crushing sintered components into finer particles, resulting in more irregular and angular shapes, whereas pelletized sintered tungsten carbide is generally rounded or spherical in shape.

Briefly, in a typical process for making cemented tungsten carbide, a tungsten carbide powder having a predetermined size (or within a selected size range) is mixed with a suitable quantity of cobalt, nickel, or other suitable binder. The mixture is typically prepared for sintering by either of two techniques: it may be pressed into solid bodies often referred to as green compacts, or alternatively, the mixture may be formed into granules or pellets such as by pressing through a screen, or tumbling and then screened to obtain more or less uniform pellet size, Such green compacts or pellets are then heated in a controlled atmosphere furnace to a temperature near the melting point of cobalt (or the like) to cause the tungsten carbide particles to be bonded together by the metallic phase. Sintering globules of tungsten carbide specifically yields spherical sintered tungsten carbide. Crushed cemented tungsten carbide may further be formed from the compact bodies or by crushing sintered pellets or by forming irregular shaped solid bodies.

The particle size and quality of the sintered tungsten carbide can be tailored by varying the initial particle size of tungsten carbide and cobalt, controlling the pellet size, adjusting the sintering time and temperature, and/or repeated crushing larger cemented carbides into smaller pieces until a desired size is obtained. In one embodiment, tungsten carbide particles (unsintered) having an average particle size of between about 0.2 to about 20 microns are sintered with cobalt to form either spherical or crushed cemented tungsten carbide. In a preferred embodiment, the cemented tungsten carbide is formed from tungsten carbide particles having an average particle size of about 0.8 to about 5 microns. In some embodiments, the amount of cobalt present in the cemented tungsten carbide is such that the cemented carbide is comprised of from about 6 to 8 weight percent cobalt.

Cast tungsten carbide is another form of tungsten carbide and has approximately the eutectic composition between bitungsten carbide, $W_2C$, and monotungsten carbide, WC. Cast carbide is typically made by resistance heating tungsten in contact with carbon, and is available in two forms: crushed cast tungsten carbide and spherical cast tungsten carbide. Processes for producing spherical cast carbide particles are described in U.S. Pat. Nos. 4,723,996 and 5,089,182, which are herein incorporated by reference. Briefly, tungsten may be heated in a graphite crucible having a hole through which a resultant eutectic mixture of $W_2C$ and WC may drip. This liquid may be quenched in a bath of oil and may be subsequently comminuted or crushed to a desired particle size to form what is referred to as crushed cast tungsten carbide. Alternatively, a mixture of tungsten and carbon is heated above its melting point into a constantly flowing stream which is poured onto a rotating cooling surface, typically a water-cooled casting cone, pipe, or concave turntable. The molten stream is rapidly cooled on the rotating surface and forms spherical particles of eutectic tungsten carbide, which are referred to as spherical cast tungsten carbide.

The standard eutectic mixture of WC and $W_2C$ is typically about 4.5 weight percent carbon. Cast tungsten carbide commercially used as a matrix powder typically has a hypoeutectic carbon content of about 4 weight percent. In one embodiment of the present invention, the cast tungsten carbide used in the mixture of tungsten carbides is comprised of from about 3.7 to about 4.2 weight percent carbon.

The various tungsten carbides disclosed herein may be selected so as to provide a bit that is tailored for a particular drilling application. For example, the type, shape, and/or size of carbide particles used in the formation of a matrix bit body may affect the material properties of the formed bit body, including, for example, fracture toughness, transverse rupture strength, and erosion resistance.

Diamond particles, either natural or synthetic, may be used to form a polycrystalline diamond composite. Polycrystalline diamond may be formed from diamond crystals and a metal catalyst, such as cobalt. Alternatively, the polycrystalline diamond composite body may be formed from a composite including diamond crystals, cobalt, and particles of carbides or carbonitrides of the transition metals selected from the group consisting of W, Ti, Ta, Cr, Mo, Cb, V, Hf, Zr, and mixtures thereof. The polycrystalline diamond layer includes individual diamond "crystals" that are interconnected. The individual diamond crystals thus form a lattice structure. A metal catalyst, such as cobalt, may be used to promote recrystallization of the diamond particles and formation of the lattice structure. Thus, cobalt particles are typically found in the interstitial spaces in the diamond lattice structure. It is also within the scope of the present disclosure that polycrystalline diamond composites may be thermally stable, i.e., have a thermal stability greater than 750° C. Such thermally stable composites may also be formed by various methods as known in the art, such as, by leaching, as described above, by varying the compaction conditions, or by using a binder having a coefficient of thermal stability closer to diamond than cobalt, for example.

PCBN may be formed by sintering boron nitride particles (typically CBN) which may be provided with a conformal coating thereon. CBN refers to an internal crystal structure of boron atoms and nitrogen atoms in which the equivalent lattice points are at the corner of each cell. Boron nitride particles typically have a diameter of approximately one micron and appear as a white powder. Boron nitride, when initially formed, has a generally graphite-like, hexagonal plate structure. When compressed at high pressures (such as 106 psi), CBN particles will be formed with a hardness very similar to diamond, and a stability in air at temperatures of up to 1400° C.

According to one embodiment of the invention, the PCBN regions may include a content of boron nitride of at least 50% by volume; at least 70% by volume in another embodiment; at least 85% by volume in yet another embodiment. In another embodiment, the cubic boron nitride content may range from 50 to 80 percent by volume, and from 80 to 99.9 percent by volume in yet another embodiment. The residual content of the polycrystalline cubic boron nitride composite may include at least one of Al, Si, and mixtures thereof, carbides, nitrides, carbonitrides and borides of Group IVa, Va, and VIa transition metals of the periodic table. Mixtures and solid solutions of Al, Si, carbides, nitrides, carbonitrides and borides of Group IVa, Va, and VIa transition metals of the periodic table may also be included.

The composite of the present disclosure may be formed by mixing the hard particles with a binder or catalyst for compaction. Catalyst materials that may be used to form the relative ductile phase of the various composites of the present disclosure may include various group IVa, Va, and VIa ductile metals and metal alloys including, but not limited to Fe, Ni, Co, Cu, Ti, Al, Ta, Mo, Nb, W, V, and alloys thereof, including alloys with materials selected from C, B, Cr, and Mn. In another embodiment, the ductile binder phase may include a compound containing silicon and/or titanium and oxygen, and a titanate, silicate, or complex oxide of a metal selected from the group of iron, cobalt, nickel and manganese in another embodiment. The use of titanates and silicates as binders is described, for example, in U.S. Pat. No. 5,769,176, which is herein incorporated by reference in its entirety. In yet another embodiment, the ductile binder phase may include any of the compositions that may comprise the ultra-thin coating discussed above.

Composites of the present disclosure may be prepared by a number of different methods, e.g., by high pressure, high temperature sintering, hot pressing, infiltration, solid state or liquid phase sintering, pneumatic isostatic forging, spark plasma sintering, microwave sintering, hot isostatic pressing (HIPing) as described in U.S. Pat. No. 5,290,507 that is incorporated herein by reference, and rapid omnidirectional compaction (ROC) as described in U.S. Pat. Nos. 4,945,073; 4,744,943; 4,656,002; 4,428,906; 4,341,577 and 4,124,888, which are each incorporated herein by reference, and combinations thereof. These processes are preferred because they can form the desired composite of this invention, which have improved properties of fracture toughness while maintaining wear resistance. In a particular embodiment, a polycrystalline diamond composite may be formed via an HPHT process.

Composite materials may be formed in a conventional manner, such as by a high pressure, high temperature sintering of "green" particles to create intercrystalline bonding between the particles. "Sintering" may involve a high pressure, high temperature (HPHT) process. Examples of high pressure, high temperature (HPHT) process can be found, for example, in U.S. Pat. Nos. 4,694,918; 5,370,195; and 4,525,178. Briefly, to form a polycrystalline diamond composite, for example, an unsintered mass of diamond crystalline particles is placed within a metal enclosure of the reaction cell of a HPHT apparatus. A metal catalyst, such as cobalt, and tungsten carbide particles may be included with the unsintered mass of crystalline particles. The reaction cell is then placed under processing conditions sufficient to cause the intercrystalline bonding between the diamond particles. If too much additional material, such as tungsten carbide or cobalt is present in the powdered mass of crystalline particles, appreciable intercrystalline bonding is prevented during the sintering process. Such a sintered material where appreciable intercrystalline bonding has not occurred is not within the definition of PCD. The transition layers may similarly be formed by placing an unsintered mass of the composite material containing diamond particles, tungsten carbide and cobalt within the HPHT apparatus. The reaction cell is then placed under processing conditions sufficient to cause sintering of the material to create the transition layer. Additionally, a preformed metal carbide substrate may be included. In which case, the processing conditions can join the sintered crystalline particles to the metal carbide substrate. Similarly, a metal substrate having or more transition layers attached thereto may be used in the process to add another transition layer or a polycrystalline diamond layer. A suitable HPHT apparatus for this process is described in U.S. Pat. Nos. 2,947,611; 2,941,241; 2,941,248; 3,609,818; 3,767,371; 4,289,503; 4,673,414; and 4,954,139.

Composites of this invention can be used in a number of different applications, such as tools for mining and construction applications, where mechanical properties of high fracture toughness, wear resistance, and hardness are highly desired. Composites of this invention can be used to form bit bodies and/or wear and cutting components in such downhole cutting tools as roller cone bits, percussion or hammer bits, and drag bits, and a number of different cutting and machine tools.

Depending on the type of particulate material used to form the composite, the various composites can be used to form a wear surface in such applications in the form of one or more substrate coating layers (i.e., PCD or PCBN), or can be used to form the substrate itself (ice., WC), or can be used to form a bit body component (such as a matrix bit body formed of WC).

Figure 3:
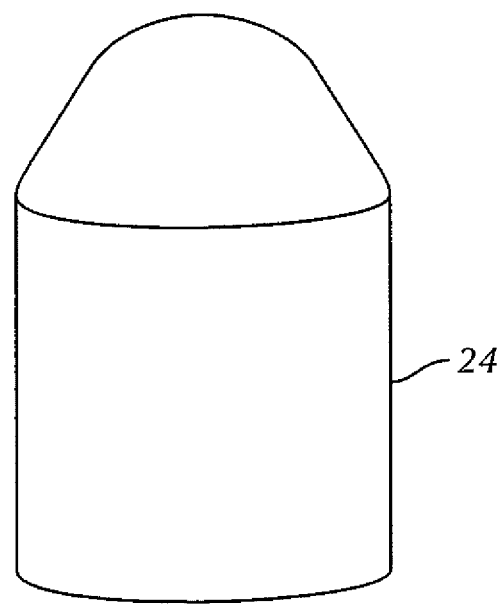
FIG. 3 is a schematic perspective side view of an insert comprising a composite of the present disclosure.
Figure 4:
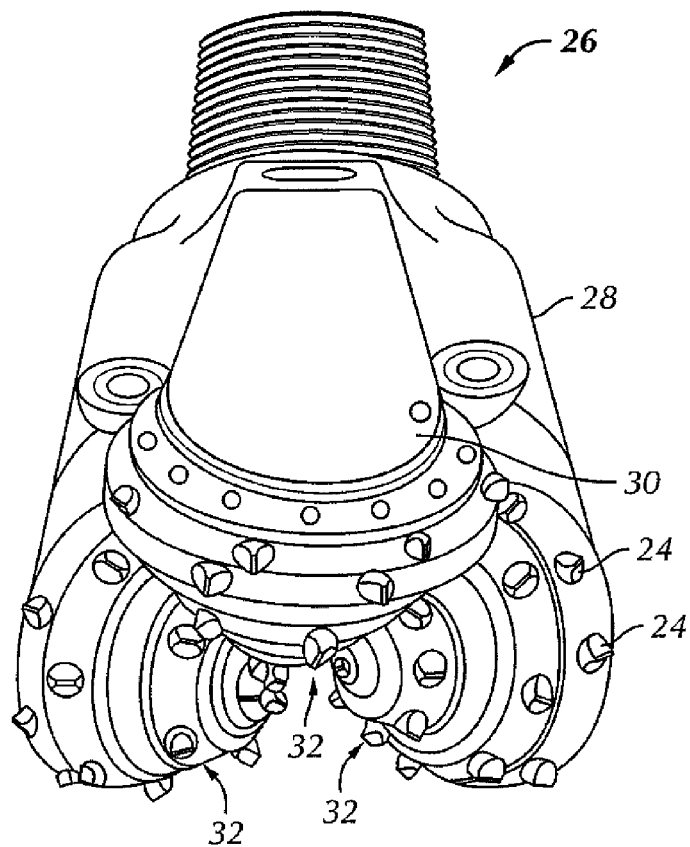
FIG. 4 is a perspective side view of a roller cone drill bit comprising a number of the inserts of FIG. 3.

FIG. 3, for example, illustrates a mining or drill bit insert 24 that is either formed from or is coated a composite material of the present disclosure. Referring to FIG. 4, such an insert 24 can be used with a roller cone drill bit 26 comprising a body 28 having three legs 30, and a cutter cone 32 mounted on a lower end of each leg. Each roller cone bit insert 24 can be fabricated according to one of the methods described above. The inserts 24 are provided in the surfaces of the cutter cone 32 for bearing on a rock formation being drilled.

Figure 5:
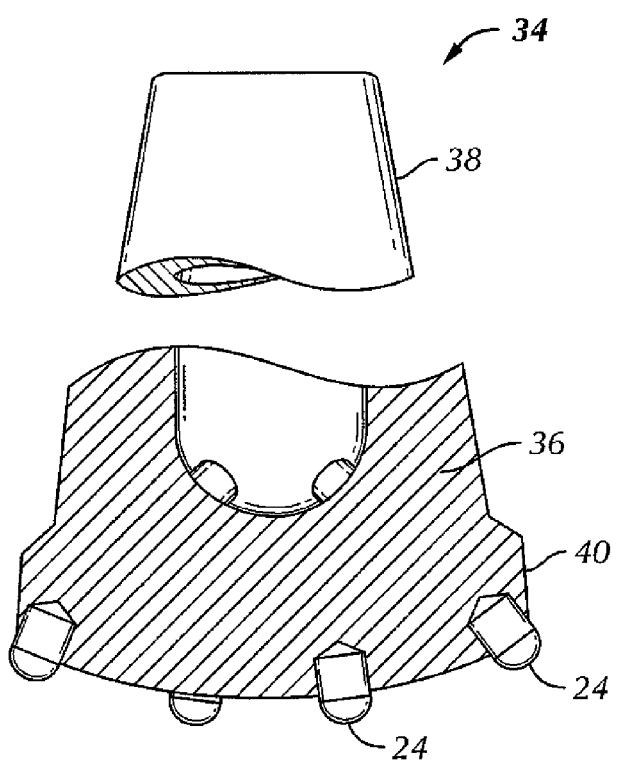
FIG. 5 is a perspective side view of a percussion or hammer bit including a number of inserts comprising a composite of the present disclosure.

Referring to FIG. 5, inserts 24 formed from composites of the present disclosure may also be used with a percussion or hammer bit 34, comprising a hollow steel body 36 having a threaded pin 38 on an end of the body for assembling the bit onto a drill string (not shown) for drilling oil wells and the like. A plurality of the inserts 24 are provided in the surface of a head 40 of the body 36 for bearing on the subterranean formation being drilled.

Figure 6:
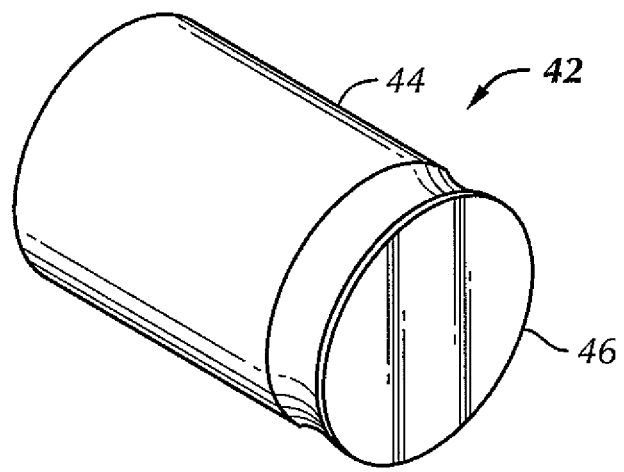
FIG. 6 is a schematic perspective side view of a shear cutter comprising a composite of the present disclosure.
Figure 7:
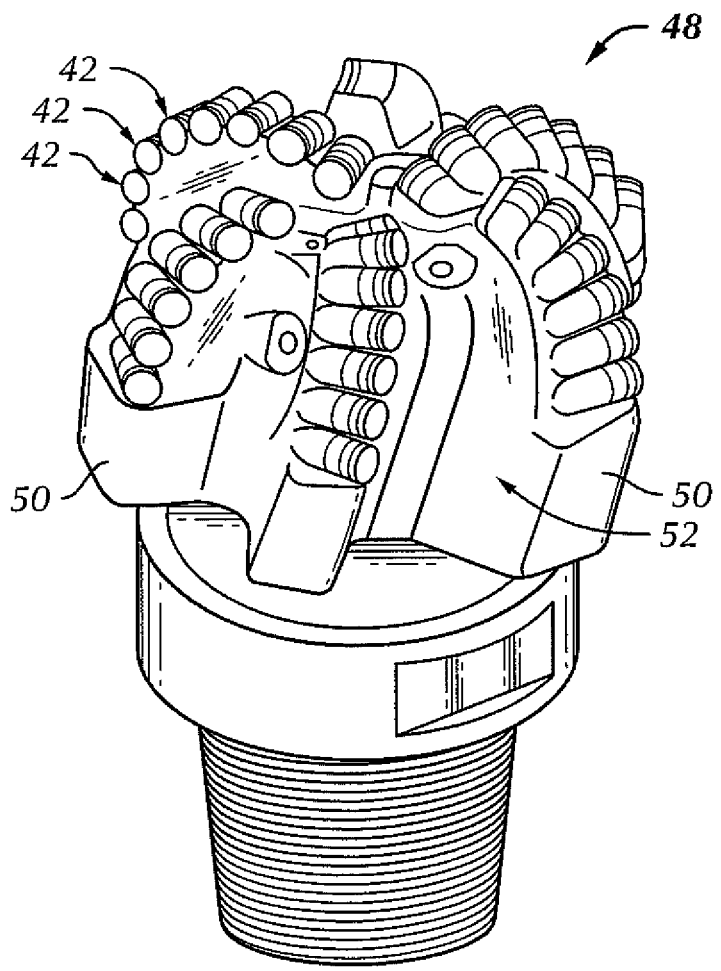
FIG. 7 is a perspective side view of a drag bit comprising a number of the shear cutters of FIG. 6.

Referring to FIG. 6, composites of the present disclosure may also be used to form shear cutters 42 that are used, for example, with a drag bit for drilling subterranean formations. More specifically, composites may be used to form a sintered surface layer on a cutter or substrate 44. Referring to FIG. 7, a drag bit 48 comprises a plurality of such shear cutters 42 that are each attached to blades 50 that extend from a head 52 of the drag bit for cutting against the subterranean formation being drilled. In a particular embodiment, the composite material may be used in the bit body of drag bit. One of skill in the art would also recognize that the body of a impregnated drag bit, for example, a diamond impregnated drag bit may be formed from coated diamond particles disclosed herein. One of ordinary skill in the art would appreciate that conventional components formed of conventional materials may instead be formed using the composite materials of the present disclosure. For example, ALD-coated CBN particles may be used to form a PCBN layer that may be used in a cutting element. Similarly, ALD-coated diamond particles may be used to form a PCD layer that may be used in cutters or other cutting elements, and ALD-coated tungsten carbide particles may be used to form a carbide substrate or insert or carbide-based bit body.

Advantageously, embodiments of the present disclosure may provide for at least one of the following. Atomic layer deposition may allow for a thin and uniform coating to be deposited on various hard particles. By providing hard particles having a thin and uniform coating thereon, sintered composite materials may be formed having a more uniform distribution of hard particles within the ductile binder. By reducing the number of aggregate hard particles and pools of binder from increased uniformity, the fracture toughness of the composite may be increased without substantially altering the composition, and thus wear resistance of the body. Further, when a polycrystalline diamond composite is formed from diamond particles provided with an ALD-coating thereon, the thermal stability of the polycrystalline diamond may be increased by the barrier coating surrounding the individual diamond particles, such as by providing a thin coating of at the diamond particle surface to promote diamond to diamond bonding during a sintering or bonding process.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed:
1. A downhole cutting tool, comprising:
a tool body;
a plurality of sintered cutting elements attached to the tool body, wherein at least one of the plurality of sintered cutting elements comprise:
    a diamond phase comprising a plurality of diamond particles, wherein at least a portion of the diamond particles comprises a conformal coating deposited by atomic layer deposition disposed across the surface of each diamond particle;
    wherein the conformal coating comprises an oxide material selected from at least one of CoO, $Al_2O_3$, and $SnO_2$;
    wherein an $Al_2O_3$ coating or a $SnO_2$ coating further comprises a layer comprising Co or CoO thereon; and
a binder phase.

2. The downhole cutting tool of claim 1, wherein the coating has a thickness ranging from about 1 to 10 nm.

3. The downhole cutting tool of claim 1, wherein the plurality of diamond particles have a particle size of less than about 500 microns.

4. The downhole cutting tool of claim 1, wherein the plurality of diamond particles have a particle size of less than about 100 microns.

5. The downhole cutting tool of claim 1, wherein the coating on the plurality of diamond particles forms the binder phase of the at least one sintered cutting element.

6. The downhole cutting tool of claim 1, wherein the conformal coating comprises $Al_2O_3$, and wherein a layer of cobalt is deposited by atomic layer deposition over the conformal coating.

7. A method of forming a downhole cutting tool, comprising:
- coating a plurality of diamond particles by atomic layer deposition disposed thereon using a fluidized bed, wherein the coating comprises $SnO_2$;
- sintering the plurality of coated diamond particles to form a sintered cutting element; and
- attaching a plurality of sintered cutting elements to a cutting tool body.

8. The method of claim 7, wherein the coating has a thickness of less than about 100 nm.

9. The method of claim 7, wherein the coating has a thickness ranging from about 1 to 10 nm.

10. The method of claim 7, further comprising:
- adding a binder material to the coated particles prior to the sintering.

11. The method of claim 10, wherein the binder material comprises Co.

12. The method of claim 7, wherein the sintering comprises at least one of high pressure, high temperature sintering, hot pressing, infiltration, solid state or liquid phase sintering, pneumatic isostatic forging, spark plasma sintering, microwave sintering, hot isostatic pressing, and rapid omnidirectional compaction.

* * * * *